United States Patent
Kufta et al.

[11] Patent Number: 5,103,315
[45] Date of Patent: Apr. 7, 1992

[54] STEREO AUDIO MUTE CIRCUIT

[75] Inventors: George T. Kufta, Glenview; Carl W. Stacy, Elmwood Park, both of Ill.

[73] Assignee: Zenith Electronics Corporation, Glenview, Ill.

[21] Appl. No.: 495,234

[22] Filed: Mar. 16, 1990

[51] Int. Cl.⁵ .......................... H04N 5/50; H04N 5/60
[52] U.S. Cl. ................................ 358/198; 358/191.1; 358/192.1; 455/194.1
[58] Field of Search ................... 358/198, 191.1, 192.1, 358/193.1; 455/200, 194, 154; 381/10–13

[56] References Cited

U.S. PATENT DOCUMENTS

| | | | |
|---|---|---|---|
| 3,882,400 | 5/1975 | Hamada | 455/194 |
| 4,387,469 | 6/1983 | Miyazaki et al. | 455/194 |
| 4,398,220 | 8/1983 | Satoh | 358/198 |
| 4,525,867 | 6/1985 | Shiratani | 455/194 |
| 4,628,539 | 12/1986 | Selwa | 455/212 |
| 4,641,190 | 2/1987 | Testin et al. | 455/194 |
| 4,703,501 | 10/1987 | Sugai et al. | 381/11 |
| 4,736,456 | 4/1988 | Maier | 358/191.1 |
| 4,737,993 | 4/1988 | DeVilbiss | 358/19.1 |
| 4,888,815 | 12/1989 | Ahlemeyer et al. | 455/194 |
| 4,897,727 | 6/1990 | Richards | 358/191.1 |

FOREIGN PATENT DOCUMENTS 61-33085 2/1986 Japan .
63-5669 1/1988 Japan .

Primary Examiner—James J. Groody
Assistant Examiner—Glenton B. Burgess

[57] ABSTRACT

A stereo television receiver includes a microprocessor for developing logic level control signals for controlling tuning, video processing and a LED stereo indicator. A sync separator circuit supplies a horizontal signal to a peak detector which supplies a logic level output signal to the microprocessor. An audio mute circuit includes a pair of transistor switches, one each coupled to the left and right audio channels. The switch base electrodes are coupled together and supplied through LEDs from two delay circuits. One delay circuit is activated by the LED stereo indicator logic level control signal and the other by a logic level output signal developed when a television signal is tuned. The period of the delay circuit activated by the tuning of a television signal is sufficiently long to permit a determination of whether a stereo or a monaural audio signal is present. The mute circuit eliminates annoying pops and clicks developed during monaural/stereo signal transitions and between the tuning of television signals.

7 Claims, 2 Drawing Sheets

STEREO AUDIO MUTE CIRCUIT

BACKGROUND OF THE INVENTION AND PRIOR ART

This invention relates generally to stereo television receivers and particularly to circuits for muting the stereo television receiver sound system to prevent noises, such as pops and clicks, due to changes in tuning or monaural/stereo audio transitions from reaching the viewer.

As is well known, stereo television receivers operate with a suppressed carrier audio signal and a pilot subcarrier signal for recovery of the suppressed carrier. Should the transmitted pilot signal be removed for monaural transmissions, or be dropped for any reason, the television receiver switches from the stereo operating mode to the monaural operating mode, which often results in an audio click or pop in the receiver speakers. Also when tuning among the various television signals, the receiver sound channels are muted to avoid annoying noises due to the absence of a television signal.

Conventionally, the audio system can be muted by connecting the emitter-collector path (output circuit) of a transistor between the audio signal channel and a source of reference potential, such as ground. The base (or input circuit) of the transistor is coupled to a suitable switching signal and the transistor is turned on (driven conductive) when audio muting is desired. Most modern television receivers include a microprocessor for providing various logic level control signals for tuning, video processing, and other miscellaneous control functions. These logic level control signals vary between a logic high first voltage level and a logic low second voltage level. The high level must be sufficient to drive the transistor into saturation to suppress the audio signal. A difficulty arises, however, since the logic low signal level in a transistor-to-transistor logic (TTL) system may be as high as 0.8 volts DC, which will turn the transistor partially on and cause attentuation and distortion of the normal audio signal. The prior art connected a diode in series with the transistor base electrode. The diode exhibits leakage and the voltage at the base of the transistor can still range from 0.3 to 0.6 volts DC. If the audio signal goes sufficiently negative, the transistor will clip the audio and produce distortion.

The present invention utilizes a light emitting diode (LED) which is capable of handling a larger audio signal and which exhibits no leakage current in its off state. Thus it maintains the transistor base at 0 volts DC which allows the audio signal to go to −0.7 volts DC before clipping (distortion) occurs. The circuit of the invention also uses two separate mute circuits, of different delay characteristics, for monaural/stereo switching and for tuning. The "tuned signal" delay circuit has approximately a 700 millisecond delay and is responsive to the absence of horizontal sync for muting the audio system. The monaural/stereo delay circuit has approximately a 150 millisecond delay and is responsive to switching of the LED indicator light for muting the audio. The long delay for tuning is sufficient to enable the receiving circuitry to determine whether a stereo audio signal is being received or not. The short delay for monaural/stereo transitions guards against dropouts of the pilot subcarrier which sometimes occur. The combination of the two delay circuits produces an attractive audio muting circuit arrangement for a stereo TV receiver utilizing TTL logic level signals.

OBJECTS OF THE INVENTION

A principal object of the invention is to provide a novel audio muting circuit.

Another object of the invention is to provide an audio muting circuit that is capable of operation with TTL logic level signals.

Another object of the invention is to provide an improved audio muting circuit.

BRIEF DESCRIPTION OF THE DRAWINGS

These and other objects and advantages of the invention will be apparent upon reading the following description in conjunction with the drawings, in which.

DESCRIPTION OF THE PREFERRED EMBODIMENT

Figure 1:
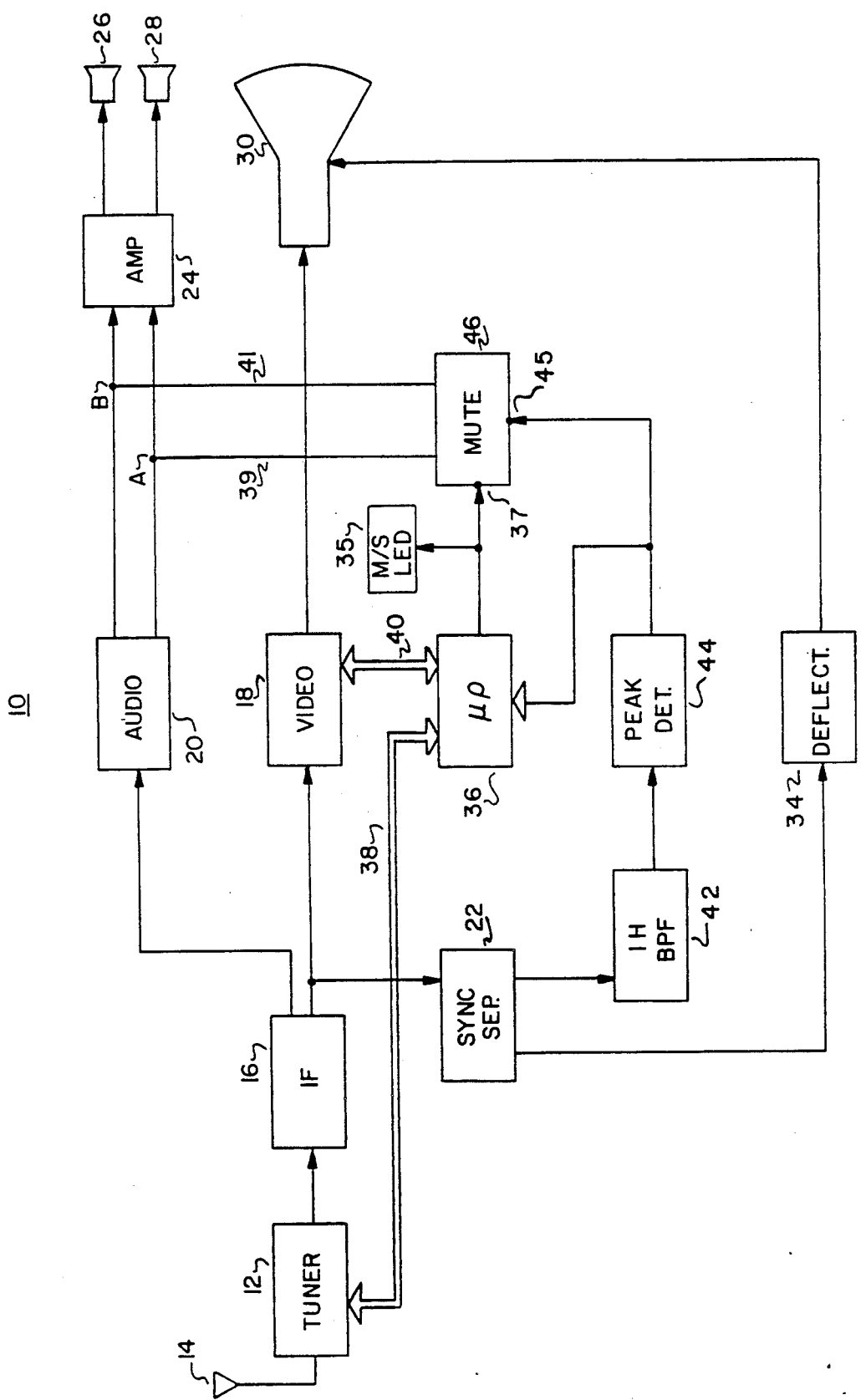
FIG. 1 is a simplified block diagram of a stereo television receiver constructed in accordance with the invention.

In FIG. 1, a stereo television receiver 10 is generally shown. The receiver includes a tuner means 12 having an antenna 14 for receiving a plurality of television signals. It will be appreciated that tuner means 12 may also be coupled to a cable input source of television signals. The output of tuner means 12 is coupled to an IF circuit 16 where the desired television signal is heterodyned in a well known manner to produce a fixed frequency intermediate frequency signal output. A suitable detector circuit for separating the audio and video IF signal is included (but not shown) in IF 16. The output of IF 16 is supplied to the input of a video processing means 18, to an audio processing means 20 and to a sync separator means 22. Audio processing means 20 is coupled over a pair of leads to an audio amplifier 24 which supplies a pair of loudspeakers 26 and 28. If the input to audio processing means 20 is a stereo television signal, the loudspeakers 26 and 28 will reproduce corresponding left and right channel audio signals. The output of video processing means 18 is coupled to a cathode ray tube 30 which is supplied with deflection and operating potentials from a deflection circuit 34 that is coupled to an output of sync separator 22. The arrangement thus described is conventional for most television receivers.

A microprocessor 36 is coupled over a first bidirectional communications bus 38 to tuner 12 and over a second bidirectional communications bus 40 to video processor 18. The microprocessor produces TTL logic level control signals for controlling the tuning of tuner 12, processing of the video signals in video processor means 18, and for controlling various other well-known functions. Another output of sync separator 22 is supplied to a one-horizontal-line (1H) bandpass filter 42, which in turn is coupled to a peak detector 44 having an output that is coupled to microprocessor 36. The peak detector 44 converts the signal from BPF 42 to a TTL output level, which is referred to herein as a logic level output signal. One logic level control signal of microprocessor 36 is supplied to a monaural/stereo LED indicator 35 which may conveniently be located on the control panel of the television receiver to indicate to the viewer when a stereo sound signal is being received. This particular control signal from microprocessor 36 is referred to as a logic level control signal, and is also coupled to an input terminal 37 on a mute circuit 46. The logic level output signal from peak detector 44 is coupled to an input terminal 45 on mute circuit 46. Mute circuit 46 is coupled over a lead 39 to a junction A and over a lead 41 to a junction B on the audio signal lines extending between audio processing means 20 and amplifier 24. As will be seen, when mute circuit 46 is activated, junctions A and B are brought to ground potential to provide muting of the audio signals from audio processing means 20.

Figure 2:
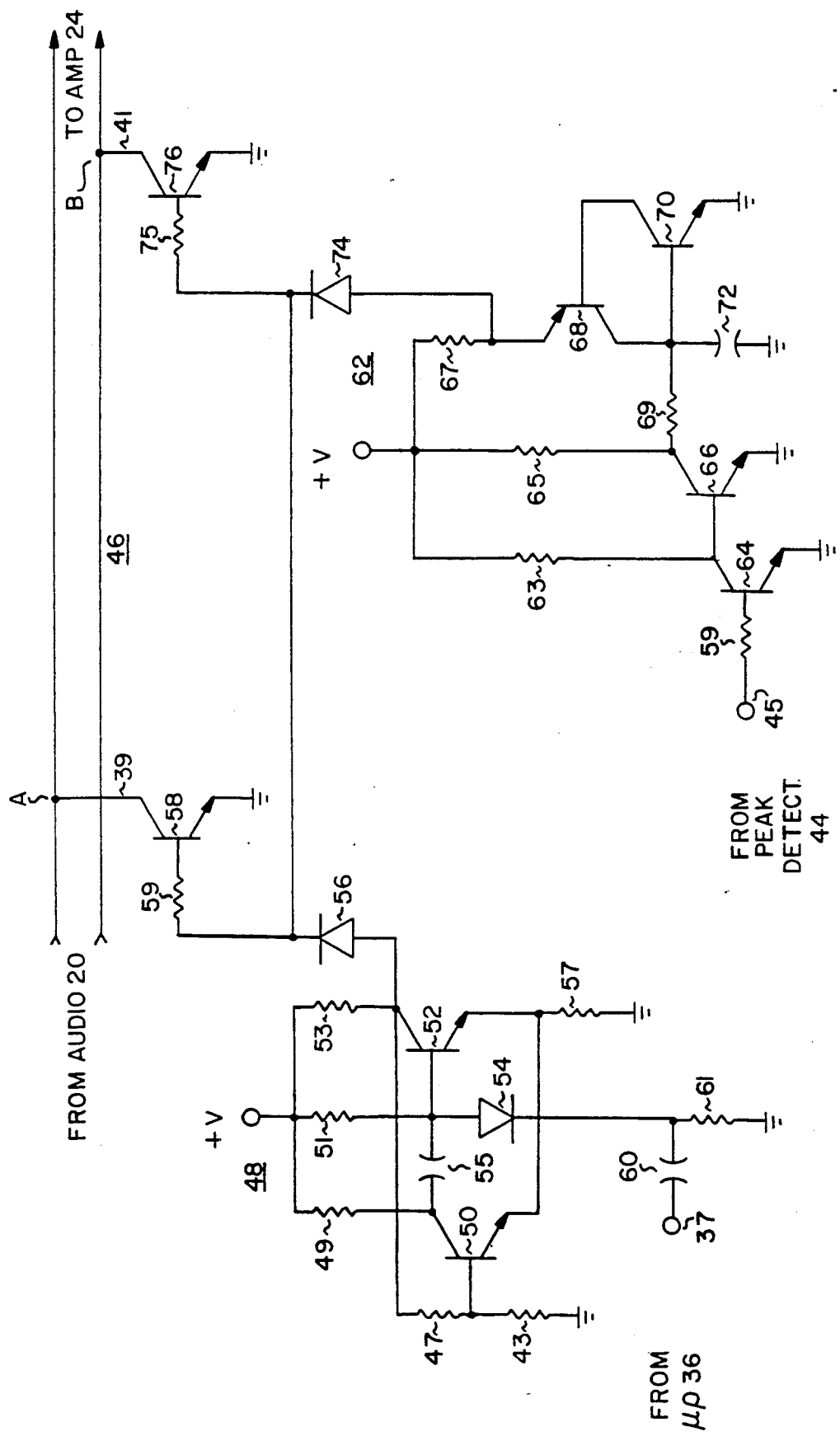
FIG. 2 is a partial schematic diagram illustrating the audio muting circuit of the invention.

In FIG. 2, a detailed schematic diagram of mute circuit 46 is disclosed. A delay circuit 48 includes a transistor 50 having a collector coupled to a source of positive voltage +V through a resistor 49 and to the base of a second transistor 52 through a capacitor 55. The base of transistor 52 is also coupled to +V through a resistor 51 and to the anode of a diode 54. The cathode of diode 54 is connected to ground through a resistor 61 and to input terminal 37 through a capacitor 60. The collector of transistor 52 is connected to +V through a resistor 53 and to a voltage divider consisting of a pair of resistors 47 and 43 connected to ground. The junction of the voltage divider is connected to the base of transistor 50. The emitters of transistors 50 and 52 are joined together and connected to ground through a resistor 57. The collector of transistor 52 is connected to the anode of an LED 56, the cathode of which is connected through a resistor 59 to the base of a switch transistor 58. The emitter of switch transistor 58 is connected to ground and its collector is connected via lead 39 to junction A on one of the audio signal leads.

Another delay circuit 62 includes a transistor 64 having a grounded emitter and a base that is connected to input terminal 45 through a resistor 59. The collector of transistor 64 is connected to the base of a transistor 66 having its emitter connected to ground. The collector of transistor 64 is connected through a resistor 63 to a source of positive voltage +V. The collector of transistor 66 is connected through a resistor 65 to +V and through a resistor 69 to the base of a transistor 70. The emitter of transistor 70 is connected to ground, its collector is connected to the base of a transistor 68, the collector of which is connected to the base of transistor 70 and to ground through a capacitor 72. The emitter of transistor 68 is connected through a resistor 67 to +V and to the anode of an LED 74, the cathode of which is connected to the cathode of LED 56. Another switch transistor 76 has its emitter connected to ground, its base connected through a resistor 75 to the cathode of LED 56 (and LED 74) and its collector connected to lead 41 that is coupled to junction B on the other audio signal lead. As indicated in the drawings, input terminal 37 receives the TTL logic level control signal developed when a stereo television receiver is being received, and input terminal 45 is supplied with the logic level output signal (at a LOW state) when no television signal is being received, such as when tuning between television channels.

In operation, delay circuit 48 is effective to introduce audio muting of about 150 milliseconds duration under control of the logic level control signal at input terminal 37. The circuit is essentially a one-shot multivibrator. In response to the logic level control signal, capacitor 60 differentiates the signal to develop a signal edge. When the potential at the junction of capacitor 60 and resistor 61 goes from high to low, the base of transistor 52 is brought near ground potential and transistor 52 is turned off. When the transistor 52 is driven nonconductive, the voltage at its collector rises and drives LED 56 conductive and develops a sufficient potential across the voltage divider (consisting of resistors 47 and 43) that transistor 50 is driven conductive. Conduction of LED 56 drives both switch transistors 58 and 76 into saturation and pulls junctions A and B to ground potential to mute the audio signals. When transistor 50 conducts, capacitor 55 charges through resistor 51. While capacitor 55 is charging, the input is effectively disabled and is reset only when the capacitor 55 is fully charged, which occurs after about 150 milliseconds. During this period, the LED 56 is effective to keep the switch transistors 58 and 76 in saturation.

Delay circuit 48 is effective for reducing audio interference caused by switching between the monaural and stereo modes. Such changes, as mentioned previously, can occur for a number of reasons and may result in the loss of the pilot subcarrier signal. Such changes may also occur during tuning when there may not be a television signal present and while the television receiver is determining whether a received signal is monaural or stereo.

Delay circuit 62 mutes the audio signals in response to a "no tuned" signal condition. This generally corresponds to the television receiver being tuned between television channels. Under a no tuned signal condition, transistor 64 is off and transistors 66 is on by virtue of the bias supplied through resistor 63. The collector of transistor 66 is therefore near ground potential and capacitor 72 discharges through resistor 69. Transistor 70 turns off when capacitor 72 is discharging and the emitter of transistor 68 rises very quickly toward +V voltage, turning on switch transistors 58 and 76 through LED 74. When a TV signal is detected, the base of transistor 64 rises in voltage and transistor 64 is driven conductive. In so doing, its collector is placed near ground potential and transistor 66 is turned off. Capacitor 72 begins to charge through resistors 65 and 69 at a relatively slow rate since the time constant is long. The base of transistor 70 rises to about 0.6 to 0.7 volts, at which point transistor 70 is turned on and causes transistor 68 to turn on and very rapidly charge capacitor 72. The emitter of transistor 68 goes low when transistor 68 turns on and switch transistors 58 and 76 are turned off. As mentioned, the time delay is about 700 milliseconds so that the audio circuit is muted for 700 milliseconds after the logic level output signal indicates the existence of a no tuned signal condition. The long delay permits a determination of whether the incoming signal is monaural or stereo. Thus the stereo signal determining apparatus (not shown) has time to adjust system operation. In the vast majority of instances, that determination is made before the time delay initiated by the logic level output signal.

The system using LEDs 56 and 74 for controlling the turning on and off of the switch transistors 58 and 76 has larger signal handling capability and precludes distortion from signal clipping due to leakage current in conventional diodes. The individual delay circuits are arranged such that annoying pops and clips due to TV signal dropout and monaural/stereo switching are substantially eliminated.

It is recognized that numerous changes in the described embodiment of the invention will be apparent to those skilled in the art without departing from its true spirit and scope. The invention is to be limited only as defined in the claims.

What is claimed is:

1. In a television receiver of the type including tuning means for receiving and detecting a television signal, sync signal separating means for developing timing signals for said television receiver and deflection signals for a display device, video means for driving the display device with video information in the television signal, audio means for reproducing the audio accompaniment of the television signal, and a microprocessor supplying first logic level control signals for controlling the tuning means and the video means, the improvement comprising:

transistor switching means coupled to said audio means for muting said audio means responsive to a logic level output signal; and a light emitting diode coupling said logic level output signal to said transistor switching means.

2. The receiver of claim 1, further including a first delay means coupled between said logic level output signal and said light emitting diode.

3. The receiver of claim 2, further including:

a stereo indicator and means for driving said stereo indicator with a second logic level control signal from said microprocessor;

a second light emitting diode; and a second delay means, of lesser time duration than said first delay means, coupled between said second logic level control signal and said second light emitting diode.

4. A stereo television receiver including video processing means and monaural/stereo audio processing means:

monaural/stereo indicator means for indicating the operating mode of said monaural/stereo audio processing means;

tuning means for selectively tuning among a plurality of television signals;

means for developing a logic level output signal when a television signal is tuned;

microprocessor means developing first logic level control signals for controlling said tuning means and said video processing means and a second logic level control signal for said indicator means; and mute means controlled by said logic level output signal and said second logic level control signal for muting said audio processing means during tuning of a telvision signal and during reception of a monaural/stereo indicator signal.

5. The receiver of claim 4 wherein said mute means comprises a first delay means coupled to said logic level output signal for maintaining said audio processing means muted for a predetermined time period after a television signal is tuned to determine whether the received television signal includes a stereo or a monaural audio signal.

6. The receiver of claim 5 wherein said mute means further includes transistor means having an output circuit coupled between said audio processing means and a source of reference potential and an input circuit coupled to said first delay means through a first light emitting diode.

7. The receiver of claim 6 wherein said mute means further includes second delay means coupled between said second logic level control signal and said transistor means through a second light emitting diode for maintaining said audio processing means muted for a duration less than said time period.

* * * * *